United States Patent
Kim et al.

(10) Patent No.: US 7,725,135 B2
(45) Date of Patent: May 25, 2010

(54) MOBILE TERMINAL AND A SOUND PRESSURE CONTROL METHOD

(75) Inventors: Se Hwan Kim, Suwon-si (KR); Myoung Woo Han, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 664 days.

(21) Appl. No.: 11/726,242

(22) Filed: Mar. 21, 2007

(65) Prior Publication Data

US 2008/0070531 A1    Mar. 20, 2008

(30) Foreign Application Priority Data

Sep. 19, 2006    (KR) ...................... 10-2006-0090829

(51) Int. Cl.
     *H04B 1/38*      (2006.01)
     *H04M 1/00*      (2006.01)
     *H03G 3/00*      (2006.01)

(52) U.S. Cl. .................. 455/567; 455/234.1; 381/107

(58) Field of Classification Search ................. 455/567, 455/550.1, 200.1, 230, 232.1, 234.1, 234.2; 381/94.1, 104, 107
See application file for complete search history.

(56) References Cited

U.S. PATENT DOCUMENTS

| | | | |
|---|---|---|---|
| 4,741,018 A | 4/1988 | Potratz et al. | |
| 5,448,620 A * | 9/1995 | Gershkovich et al. | 455/552.1 |
| 5,544,242 A | 8/1996 | Robinson | |
| 6,070,088 A * | 5/2000 | Satoh | 455/550.1 |
| 2006/0217068 A1* | 9/2006 | Angelopoulos | 455/63.1 |

FOREIGN PATENT DOCUMENTS

| | | |
|---|---|---|
| KR | 1020010054215 | 7/2001 |
| KR | 1020060059658 | 6/2006 |

* cited by examiner

*Primary Examiner*—Nguyen Vo
(74) *Attorney, Agent, or Firm*—The Farrell Law Firm, LLP (57) ABSTRACT

A mobile terminal and sound pressure control method using sound saturation sensing are disclosed. The mobile terminal has a target digital value of an adequate output sound pressure level at a maximum volume level. The sound pressure control method includes: determining a digital value corresponding to a maximum output sound pressure level of an externally sourced audio material, wherein the externally sourced audio material is being replayed for the first time at a preset gain at the maximum volume level; comparing the determined digital value with the target digital value; adjusting, if the determined digital value is not equal to the target digital value, the gain so that a digital value corresponding to the adjusted gain is equal to the target digital value; and storing the adjusted gain as a gain value associated with the maximum volume level for the externally sourced audio material.

21 Claims, 5 Drawing Sheets

|  | EXTERNALLY SOURCED AUDIO MATERIAL 1 | | EXTERNALLY SOURCED AUDIO MATERIAL 2 | | ... |
| --- | --- | --- | --- | --- | --- |
|  | PRESET GAIN | ADJUSTED GAIN | PRESET GAIN | ADJUSTED GAIN | ... |
| $V_{ol}$.max | 17 | 20 | 17 | 14 | ... |
| P VALUE | 180 | 200 | 220 | 200 | ... |

( M VALUE : 200 )

| EXTERNALLY SOURCED AUDIO MATERIAL \ VOLUME | 5 | 4 | 3 | 2 | 1 |
| --- | --- | --- | --- | --- | --- |
| EXTERNALLY SOURCED AUDIO MATERIAL 1 | 20 | 17 | 13 | 8 | 2 |
| EXTERNALLY SOURCED AUDIO MATERIAL 2 | 14 | 12 | 8 | 5 | 1 |
| ⋮ | ⋮ | ⋮ | ⋮ | ⋮ | ⋮ |

MOBILE TERMINAL AND A SOUND PRESSURE CONTROL METHOD

PRIORITY

This application claims priority under 35 U.S.C. §119 to an application entitled "MOBILE TERMINAL AND SOUND PRESSURE CONTROL METHOD" filed in the Korean Intellectual Property Office on Sep. 19, 2006 and assigned Ser. No. 2006-90829, the contents of which are incorporated herein by reference.

BACKGROUND OF THE INVENTION

1. Field of the Invention

The present invention relates generally to a mobile terminal and, in particular, to a mobile terminal and a sound pressure control method for the same wherein sound pressure levels of an audio material are adjusted using sound saturation sensing according to characteristics of the mobile terminal.

2. Description of the Related Art

Given the advances in communication technologies, a user in motion can readily carry a mobile terminal and transmit as well as receive phone calls at most times and places. In addition to conventional phone call processing, advanced mobile terminals, including mobile communication terminals, notebooks, Personal Digital Assistants (PDAs) and portable multimedia players, support various functions such as text message and image transmission, Motion Pictures Experts Group-1 (MPEG-1) audio layer 3 (MP3) file playing, ring tone and ring back tone personalization, and gaming.

A mobile terminal includes regular audio materials such as ring tones and melodies, which are suitably customized to factors such as resonance properties of the mobile terminal, the maximum output sound pressure level or stress producible by an embedded speaker. However, externally sourced audio materials such as MP3 files, ring tones and ring back tones that are downloaded from external providers may be not optimized for the mobile terminal, and are reproduced at a preset gain.

When the maximum sound pressure level of an externally sourced audio material to be replayed is lower than that of the mobile terminal, sound pressure levels of the speaker are low even at the maximum volume level. When the maximum sound pressure level of an externally sourced audio material is higher than that of the mobile terminal, raising volume levels may cause sound distortion due to sound saturation. An extended period of reproduction at a volume level exceeding the maximum volume level overloads the speaker, and may cause permanent damage to the speaker.

Further, uniform reproduction of externally sourced audio materials at a preset gain may limit enhancement of signal-to-noise characteristics of the individual externally sourced audio materials.

SUMMARY OF THE INVENTION

The present invention has been made in view of the above-described problems, and an object of the present invention is to provide a mobile terminal and a sound pressure control method for the same wherein an externally sourced audio material is tuned and reproduced according to resonance properties of the mobile terminal and the maximum output sound pressure level or stress producible by a speaker.

Another object of the present invention is to provide a mobile terminal and a sound pressure control method for the same capable of enhancing signal-to-noise characteristics of an externally sourced audio material.

In accordance with an aspect of the present invention, there is provided a sound pressure control method for a mobile terminal that has a target digital value of an adequate output sound pressure level at a maximum volume level, the method including determining a digital value corresponding to a maximum output sound pressure level of an externally sourced audio material, wherein the externally sourced audio material is being replayed for the first time at a preset gain at the maximum volume level; comparing the determined digital value with the target digital value; adjusting, if the determined digital value is not equal to the target digital value, the gain so that a digital value corresponding to the adjusted gain is equal to the target digital value; and storing the adjusted gain as a gain value associated with the maximum volume level for the externally sourced audio material.

The step of determining a digital value may include rectifying an output signal from the externally sourced audio material; and converting the rectified output signal into digital values.

Preferably, in the step of adjusting the gain at least one of a gain of a coder/decoder (codec) and a gain of an amplifier is adjusted.

Preferably, the step of adjusting the gain includes increasing, if the determined digital value is less than the target digital value, the codec gain within the adjustment capability of the codec so that the difference between the digital value corresponding to the adjusted gain and the target digital value is minimized. In addition, if the difference is not zero, the amplifier gain is increased so that the digital value corresponding to the further adjusted gain is equal to the target digital value.

Preferably, the step of adjusting the gain further includes decreasing, if the determined digital value is greater than the target digital value, the amplifier gain within the adjustment capability of the amplifier so that the difference between the digital value corresponding to the adjusted gain and the target digital value is minimized. In addition, if the difference is not zero, the codec gain is decreased so that the digital value corresponding to the further adjusted gain is equal to the target digital value.

The sound pressure control method may further include setting and storing gain values associated with individual volume levels lower than the maximum volume level with respect to the gain value associated with the maximum volume level. Preferably, the gains associated with the individual volume levels lower than the maximum volume level are adjusted through codec gain adjustment.

The sound pressure control method may further include replaying, after setting the gain values associated with the individual volume levels, the externally sourced audio material using the set gain values.

Preferably, the target digital value corresponds to 80% of the output sound pressure level at the maximum volume level of a speaker.

The sound pressure control method may further include storing, if the determined digital value is equal to the target digital value, the preset gain as a gain value associated with the maximum volume level for the externally sourced audio material.

In accordance with another aspect of the present invention, there is provided a mobile terminal including a memory unit for storing a plurality of externally sourced audio materials, a target digital value of an adequate output sound pressure level at a maximum volume level for an externally sourced audio material, and a gain setting table for the stored externally sourced audio materials; an audio output unit for generating sounds with a preset gain at the maximum volume level for an externally sourced audio material selected for replay for the first time; a digital value producer for determining a digital value corresponding to a maximum output sound pressure level of the selected externally sourced audio material; a comparator for comparing the determined digital value with the target digital value; a gain adjuster for adjusting, if the determined digital value is not equal to the target digital value, the gain so that a digital value corresponding to the adjusted gain is equal to the target digital value; and a gain setter for storing the adjusted gain in the gain setting table as a gain value associated with the maximum volume level for the selected externally sourced audio material.

The audio output unit may include a coder/decoder (codec) for converting the selected externally sourced audio material into an analog signal; a sound chip having an amplifier for amplifying the analog signal; and a speaker for outputting the amplified analog signal.

The digital value producer may include a rectifier for rectifying the amplified analog signal; and an Analog to Digital Converter (ADC) for converting the rectified analog signal into digital values.

The gain adjuster may include a codec gain adjuster for adjusting a gain of the codec to change the output sound pressure levels; and an amplifier gain adjuster for adjusting a gain of the amplifier to change the output sound pressure levels.

BRIEF DESCRIPTION OF THE DRAWINGS

The above and other objects, features and advantages of the present invention will be more apparent from the following detailed description when taken in conjunction with the accompanying drawings, in which.

DETAILED DESCRIPTION OF PREFERRED EMBODIMENTS

Hereinafter, preferred embodiments of the present invention are described in detail with reference to the accompanying drawings. The same reference symbols identify the same or corresponding elements in the drawings. Detailed descriptions of constructions or processes known in the art may be omitted to avoid obscuring the invention in unnecessary detail.

Figure 1:
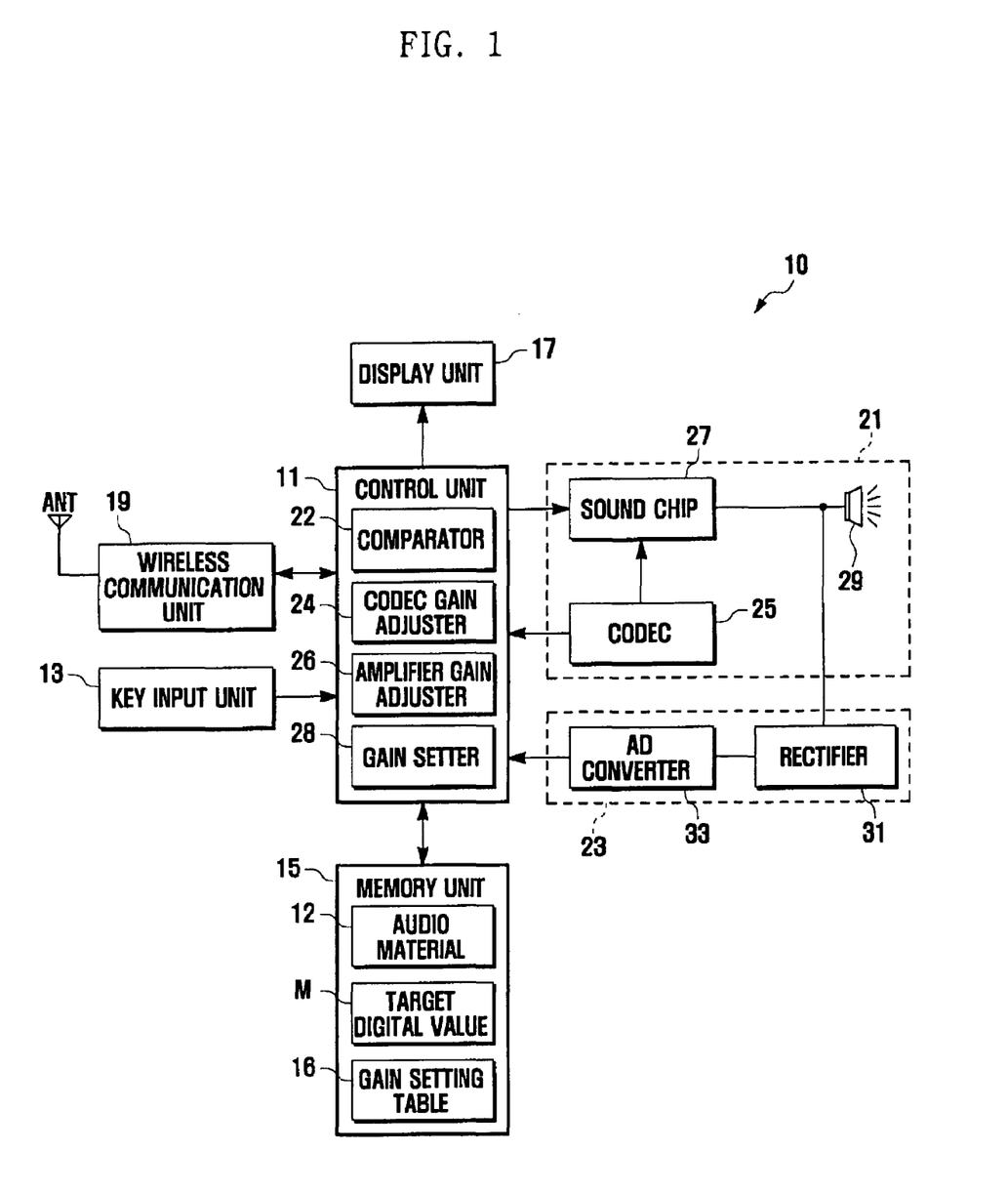
FIG. 1 is a block diagram illustrating a configuration of a mobile terminal according to the present invention.

FIG. 1 illustrates a configuration of a mobile terminal according to the present invention. Referring to FIG. 1, the mobile terminal 10 includes a control unit 11, a key input unit 13, a memory unit 15, a display unit 17, a wireless communication unit 19, an audio output unit 21, and a digital value producer 23.

The control unit 11 controls the overall operation of the mobile terminal 10. In particular, the control unit 11 controls gain adjustment through saturation sensing of an externally sourced audio material.

The key input unit 13 includes a plurality of keys for controlling operations of the mobile terminal 10, and sends a key value associated with a key input by the user to the control unit 11. User commands through the key input unit 13 can be related to events for reproduction of externally sourced audio materials.

The memory unit 15 stores control programs of the portable terminal 10, and data resulting from execution of the control programs. The memory unit 15 stores a gain adjustment program for externally sourced audio materials, and information necessary for and resulting from execution of the gain adjustment program.

The display unit 17 displays various menus and data stored in the memory unit 15 on a screen. In particular, the display unit 17 displays visual images necessary for executing events related to reproduction of externally sourced audio materials. The display unit 17 may include Liquid Crystal Display (LCD) devices.

The wireless communication unit 19 modulates data to be transmitted from the control unit 11 into a signal, upconverts the frequency of the modulated signal, and transmits the upconverted signal via an antenna ANT. The wireless communication unit 19 receives a signal via the antenna ANT, downcoverts the frequency of the received signal, demodulates the downcoverted signal into data, and sends the demodulated data to the control unit 11.

The audio output unit 21 reproduces an audio material 12 stored in the memory unit 15 for output. The audio output unit 21 includes a coder/decoder (codec) 25, sound chip 27, and speaker 29. The codec 25 converts the audio material 12 in a digital format into an analog signal, and also converts an analog signal such as a voice signal into a digital signal. The sound chip 27 amplifies an analog signal from the codec 25, and includes an amplifier for amplifying the analog signal. The speaker 29 outputs an amplified analog signal.

The digital value producer 23 computes digital values of an amplified analog signal from (namely, digital values of output sound pressure levels of an externally sourced audio material) the sound chip 27 to the speaker 29. In particular, the digital value producer 23 produces digital values corresponding to sound pressure levels of an externally sourced audio material reproduced with a preset gain at the maximum volume level. The digital value producer 23 includes a rectifier 31 and an Analog to Digital Converter (ADC) 33. The rectifier 31 rectifies a portion of an amplified analog signal. The ADC 33 converts the rectified portion of the analog signal into digital values, and sends the digital values to the control unit 11.

Figure 6:
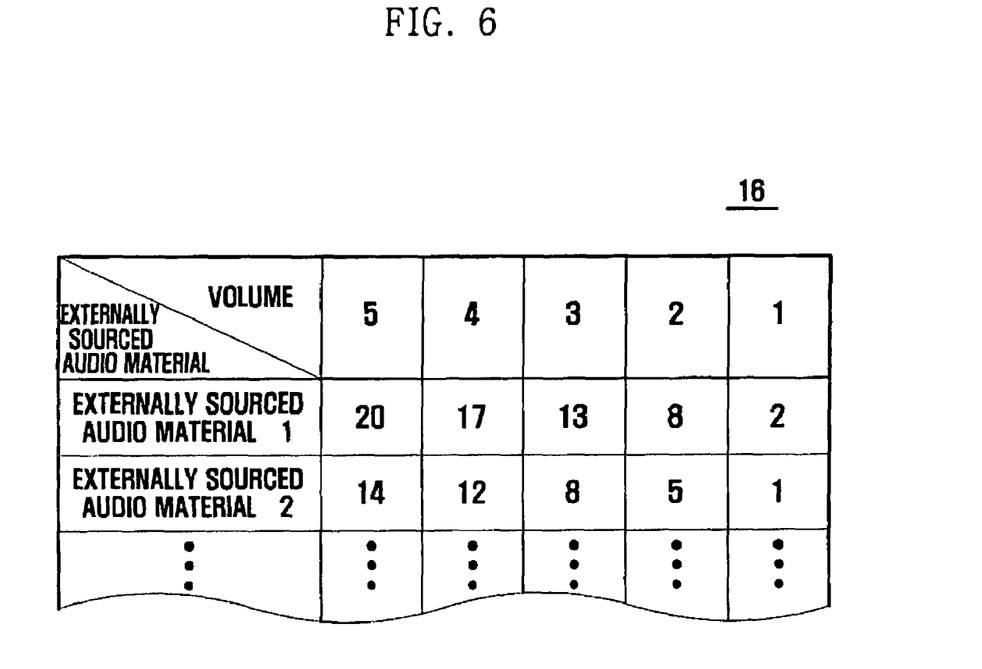
FIG. 6 illustrates a gain setting table produced by the procedure of FIG. 3.

In particular, the memory unit 15 stores a plurality of audio materials 12, a target digital value M, and a gain setting table 16. The target digital value M corresponds to an output sound pressure level considered adequate (Vmax of FIG. 4C) at the maximum volume level. The, output sound pressure level considered adequate is a critical point of sound saturation, and, in the present invention, is an output sound pressure level of a test audio material at 80% of the maximum volume level of the speaker 29. The gain setting table 16 includes gain values, in steps of volume levels, set through gain adjustment for each externally sourced audio material, as illustrated in FIG. 6.

The control unit 11 includes a comparator 22, a codec gain adjuster 24, an amplifier gain adjuster 26, and a gain setter 28. The comparator 22 compares a calculated digital value that corresponds to the maximum output sound pressure level of an externally sourced audio material with the target digital value M. If the calculated digital value is equal to the target digital value M, the gain setter 28 stores a preset gain in the gain setting table 16 as a gain value associated with the maximum volume level for the externally sourced audio material. If the calculated digital value is not equal to the target digital value M, the codec gain adjuster 24 and amplifier gain adjuster 26 performs a gain adjustment operation until a new digital value corresponding to the adjusted gain becomes equal to the target digital value M. The gain setter 28 stores the adjusted gain value at the time when the corresponding digital value is equal to the target digital value M, in the gain setting table 16 as a gain value associated with the maximum volume level for the externally sourced audio material.

The codec gain adjuster 24 alters digital values corresponding to output sound pressure levels by adjusting the gain of the codec 25. The amplifier gain adjuster 26 alters digital values corresponding to output sound pressure levels by adjusting the gain of the amplifier in the sound chip 27. Although the amplifier gain adjuster 26 is included in the control unit 11 in FIG. 1, it may also be separately installed outside the control unit 11.

Figure 2:
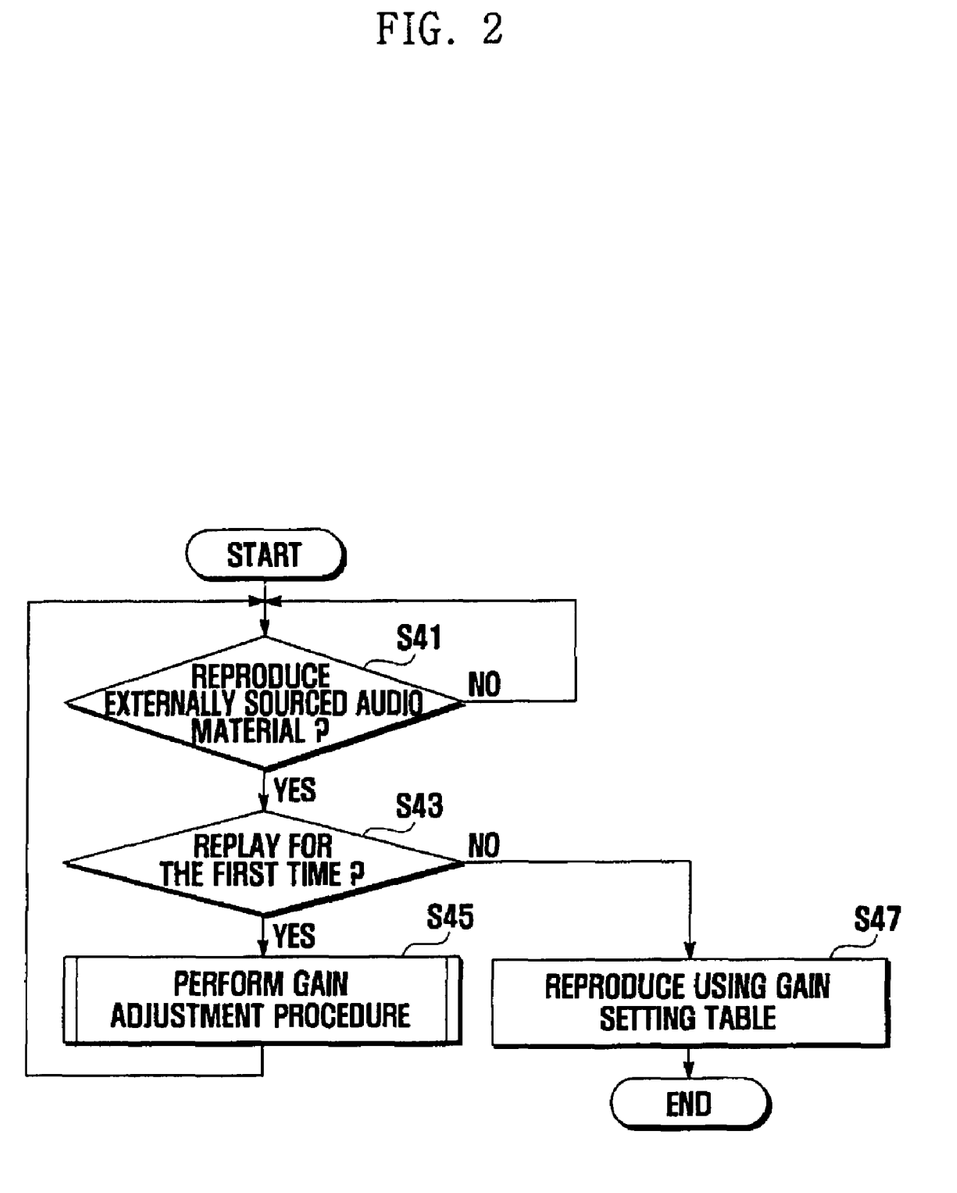
FIG. 2 is a flow chart illustrating a sound pressure control method using sound saturation sensing according to another embodiment of the present invention.

FIG. 2 is a flow chart illustrating a sound pressure control method using sound saturation sensing according to another embodiment of the present invention. Referring to FIGS. 1 and 2, the sound pressure control method is described as follows.

When the user enters a replay request for an externally sourced audio material through the key input unit 13 in step S41, the control unit 11 determines whether the requested externally sourced audio material has been reproduced in step S43. If the externally sourced audio material has not been reproduced, the control unit 11 performs a gain adjustment procedure for the externally sourced audio material in step S45. If the externally sourced audio material has been reproduced, the control unit 11 replays the externally sourced audio material using a gain setting table 16 in step S47.

In the present embodiment, although an externally sourced audio material is gain-adjusted at the time of replay for the first time, the user may force an externally sourced audio material that has been gain-adjusted to undergo new gain adjustment.

Figure 3:
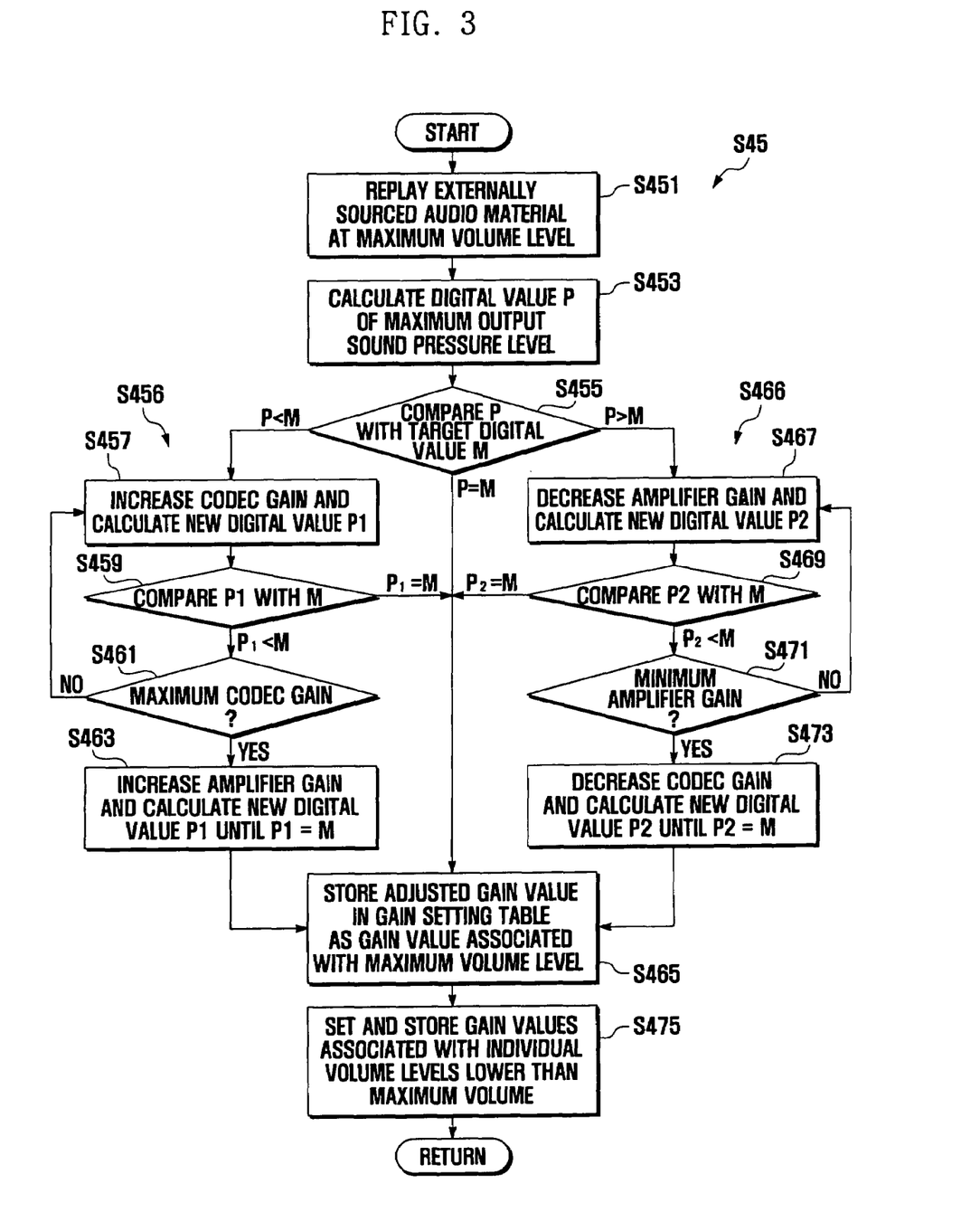
FIG. 3 is a flow chart illustrating a gain adjustment procedure of the method of FIG. 2.
Figure 4A:
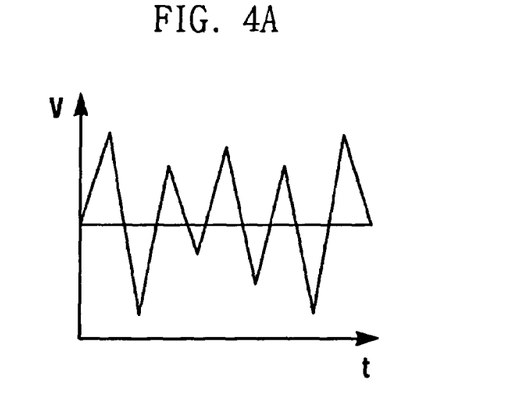
FIGS. 4A-4C are graphs that illustrate the computation of digital values corresponding to output sound pressure levels.
Figure 4B:
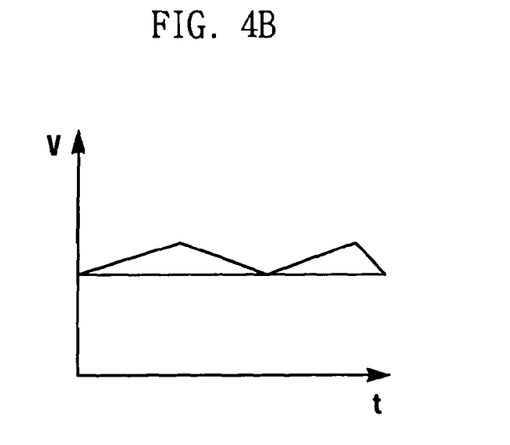
Figure 4C:
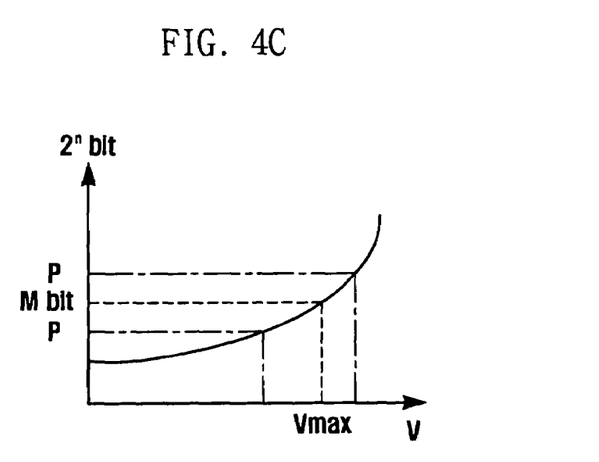
Figure 5:
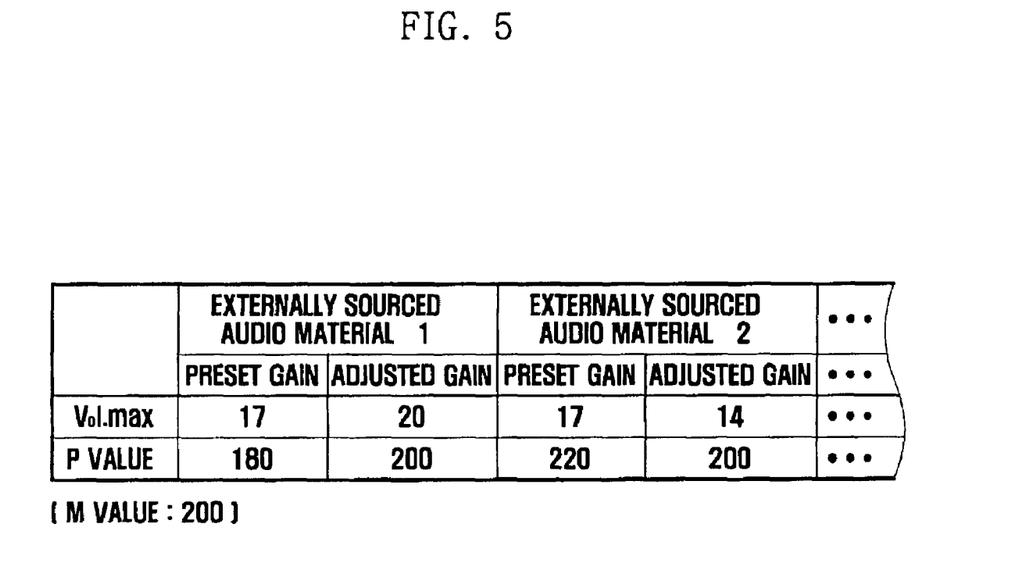
FIG. 5 illustrates gain values adjusted at the maximum volume level in the procedure of FIG. 3.

FIG. 3 is a flow chart illustrating the gain adjustment procedure of step S45 of the method of FIG. 2; FIGS. 4A-4C are graphs that illustrate computation of digital values corresponding to output sound pressure levels; FIG. 5 illustrates gain values adjusted at the maximum volume level in the procedure of FIG. 3; and FIG. 6 illustrates a gain setting table produced by the procedure of FIG. 3. The target digital value M is stored in the memory unit 15. Referring to FIGS. 1 to 6, the gain adjustment procedure is described as follows.

The control unit 11 controls the audio output unit 21 to reproduce the externally sourced audio material with a preset gain at the maximum volume level in step S451. That is, the control unit 11 sends the externally sourced audio material stored in the memory unit 15 to the codec 25. The codec 25 converts the externally sourced audio material in a digital format into an analog signal, and sends the analog signal to the sound chip 27. The sound chip 27 amplifies the analog signal, and outputs the amplified analog signal to the speaker 29.

During replay, the digital value producer 23 calculates a digital value P of the maximum output sound pressure level in the amplified analog signal from the sound chip 27 to the speaker 29 in step S453. Referring to FIG. 4, the amplified analog signal is an AC signal as shown FIG. 4A, in which 'V' denotes voltage and 't' denotes time. The amplified analog signal is passed through the rectifier 31 and converted into a DC signal as shown FIG. 4B. The DC signal is fed to the AD converter 33 and converted into digital values. For example, the digital value P may be obtained through 8 KHz sampling.

The comparator 22 of the control unit 11 compares the calculated digital value P with the target digital value M in step S455. Because the externally sourced audio material is usually not optimized for the mobile terminal 10, the calculated digital value P be than less or greater than the target digital value M.

If P is equal to M, the gain setter 28 stores the preset gain in the gain setting table 16 as a gain value associated with the maximum volume level in step S465. If P is not equal to M, the codec gain adjuster 24 and amplifier gain adjuster 26 performs a gain adjustment operation to make a new digital value P1 or P2 corresponding to an adjusted gain to the target digital value M step S456 or S466. When a calculated digital value Px is made equal to the target digital value M, the gain setter 28 stores the adjusted gain in the gain setting table 16 as a gain value associated with the maximum volume level in step S465.

For gain adjustment, step S456 is performed when the calculated digital value P is less than the target digital value M, and step S466 is performed when P is greater than M. Digital values are changed through codec gain adjustment and amplifier gain adjustment.

In the case when the initially calculated digital value P is less than the target digital value M in step S456, the codec gain adjuster 24 increases the codec gain in step S457. The comparator 22 compares a new digital value P1 corresponding to the adjusted gain with the target digital value M in step S459. If P1 is equal to M, the gain setter 28 stores the adjusted gain in the gain setting table 16 as a gain value associated with the maximum volume level in step S465. If P1 is not equal to M, the codec gain adjuster 24 determines whether the increased codec gain is equal to the maximum codec gain in step S461.

If the increased codec gain is not equal to the maximum codec gain, steps S457 and S459 are repeated until the increased codec gain becomes equal to the maximum codec gain.

After the increased codec gain becomes equal to the maximum codec gain, the amplifier gain adjuster 26 increases the amplifier gain so as to make a digital value P1 corresponding to the adjusted gain equal to the target digital value M in step S463. The gain setter 28 stores the adjusted gain in the gain setting table 16 as a gain value associated with the maximum volume level in step S465.

In the gain adjustment to increase digital values for the output sound pressure, the codec gain is increased first in order to prevent signal-to-noise characteristics of an externally sourced audio material from degrading. An increase in gain tends to degrade signal-to-noise characteristics of an audio material, and an increase in codec gain has less adverse impact on signal-to-noise characteristics than an increase in amplifier gain.

Referring to FIG. 5, for a first externally sourced audio material, an initially calculated digital value P of 180 with a preset gain of 17 is less than the target digital value M of 200. The codec gain is increased first and then the amplifier gain is increased, to make a new digital value corresponding to the adjusted gain equal to M of 200. As a result, the preset gain of 17 is adjusted to a gain of 20 at the maximum volume level.

In the case when the initially calculated digital value P is greater than the target digital value M in step S466, the amplifier gain is decreased first and then the codec gain is increased in order not to degrade signal-to-noise characteristics of an externally sourced audio material.

The amplifier gain adjuster 26 decreases the amplifier gain to calculate a new digital value P2 corresponding to the adjusted gain in step S467. The comparator 22 compares the digital value P2 with the target digital value M in step S469. If P2 is equal to M, the gain setter 28 stores the adjusted gain corresponding to the digital value P2 in the gain setting table 16 as a gain value associated with the maximum volume level in step S465. If P2 is not equal to M, the amplifier gain adjuster 26 determines whether the decreased amplifier gain becomes equal to the minimum amplifier gain in step S471.

If the decreased amplifier gain is not equal to the minimum amplifier gain, steps S467 and S469 are repeated until the decreased amplifier gain becomes equal to the minimum amplifier gain.

After the decreased amplifier gain becomes equal to the minimum amplifier gain, the codec gain adjuster 24 decreases the codec gain so as to make a new digital value P2 corresponding to the adjusted gain equal to the target digital value M in step S473. The gain setter 28 stores the adjusted gain corresponding to the digital value P2 in the gain setting table 16 as a gain value associated with the maximum volume level in step S465.

Referring to FIG. 5, for a second externally sourced audio material, an initially calculated digital value P of 220 with a preset gain of 17 is greater than the target digital value M of 200. The amplifier gain is decreased first and then the codec gain is decreased so as to make a digital value P2 corresponding to the adjusted gain equal to M of 200. As a result, the preset gain of 17 is adjusted to a gain of 14 at the maximum volume level.

After setting the gain value for the maximum volume level, the gain setter 28 sets gain values associated with individual volume levels lower than the maximum volume level with respect to the gain value at the maximum volume level, and stores the set gain values in the gain setting table 16 in step S475. The gain values associated with individual volume levels lower than the maximum volume level are set through codec gain adjustment for enhancement of signal-to-noise characteristics of the externally sourced audio material.

FIG. 6 illustrates a gain setting table 16, in which five volume levels are used. For the first externally sourced audio material, an adjusted gain value is 20 at the maximum volume level of 5, and gain values of 17, 13, 8 and 2 are set at volume levels of 4, 3, 2 and 1, respectively. For the second externally sourced audio material, an adjusted gain value is 14 at the maximum volume level of 5, and gain values of 12, 8, 5 and 1 are set at volume levels of 4, 3, 2 and 1, respectively.

Thereafter, when an externally sourced audio material that has been gain-adjusted is requested for replay, the externally sourced audio material is reproduced according to the adjusted gain values stored in the gain setting table 16, unlike a conventional reproduction method using a preset fixed gain.

As apparent from the above description, the present invention provides a mobile terminal and a sound pressure control method for the same. When an externally sourced audio material is reproduced for the first time, a gain adjustment operation is performed, whereby a digital value of the maximum output sound pressure level is made equal to a target digital value that is set by saturation sensing of the mobile terminal and adjusted gain values are saved. After gain adjustment, the externally sourced audio material is reproduced using adjusted gain values. As a result, the gain of the output sound pressure of the externally sourced audio material is adjusted with respect to a sound saturation state of the mobile terminal, thereby tuning the externally sourced audio material for reproduction according to resonance properties of the mobile terminal and the maximum sound pressure level and stress producible by the speaker. Further, in setting a gain value at the maximum volume level, the codec gain is increased first when the gain is increased and the amplifier gain is decreased first when the gain is decreased, to enhance signal-to-noise characteristics of the externally sourced audio material.

While exemplary embodiments of the present invention have been shown and described in this specification, it will be understood by those skilled in the art that various changes or modifications of the embodiments are possible without departing from the spirit and scope of the invention as defined by the appended claims.

What is claimed is:

1. A sound pressure control method for a mobile terminal that has a target digital value of an adequate output sound pressure level at a maximum volume level, the method comprising:

determining a digital value corresponding to a maximum output sound pressure level of an externally sourced audio material, wherein the externally sourced audio material is being replayed for a first time at a preset gain at the maximum volume level;

comparing the determined digital value with the target digital value;

adjusting, if the determined digital value is not equal to the target digital value, the gain so that a digital value corresponding to the adjusted gain is equal to the target digital value; and storing the adjusted gain as a gain value associated with the maximum volume level for the externally sourced audio material.

2. The sound pressure control method of claim 1, wherein the determining a digital value step comprises:

rectifying an output signal from the externally sourced audio material; and converting the rectified output signal into digital values.

3. The sound pressure control method of claim 2, wherein in the adjusting the gain step at least one of a gain of a coder/decoder (codec) and a gain of an amplifier is adjusted.

4. The sound pressure control method of claim 3, wherein the adjusting the gain step comprises increasing, if the determined digital value is less than the target digital value, the codec gain so that the difference between the digital value corresponding to the adjusted gain and the target digital value is minimized.

5. The sound pressure control method of claim 4, wherein the adjusting the gain step further comprises increasing, if the difference is not zero, the amplifier gain so that the digital value corresponding to the further adjusted gain is equal to the target digital value.

6. The sound pressure control method of claim 3, wherein the adjusting the gain step further comprises decreasing, if the determined digital value is greater than the target digital value, the amplifier gain so that the difference between the digital value corresponding to the adjusted gain and the target digital value is minimized.

7. The sound pressure control method of claim 6, wherein the adjusting the gain step further comprises decreasing, if the difference is not zero, the codec gain so that the digital value corresponding to the further adjusted gain is equal to the target digital value.

8. The sound pressure control method of claim 2, wherein the target digital value corresponds to 80% of the output sound pressure level at the maximum volume level of a speaker.

9. The sound pressure control method of claim 1, further comprising setting and storing gain values associated with individual volume levels lower than the maximum volume level with respect to the gain value associated with the maximum volume level.

10. The sound pressure control method of claim 9, wherein the gains associated with the individual volume levels lower than the maximum volume level are adjusted through codec gain adjustment.

11. The sound pressure control method of claim 10, further comprising replaying, after setting the gain values associated with the individual volume levels, the externally sourced audio material using the set gain values.

12. The sound pressure control method of claim 1, further comprising storing, if the determined digital value is equal to the target digital value, the preset gain as a gain value associated with the maximum volume level for the externally sourced audio material.

13. A mobile terminal comprising:
   a memory unit for storing a plurality of externally sourced audio materials, a target digital value of an adequate output sound pressure level at a maximum volume level for an externally sourced audio material, and a gain setting table for the stored externally sourced audio materials;
   an audio output unit for generating sounds with a preset gain at the maximum volume level for an externally sourced audio material selected for replay for a first time;
   a digital value producer for determining a digital value corresponding to a maximum output sound pressure level of the selected externally sourced audio material;
   a comparator for comparing the determined digital value with the target digital value;
   a gain adjuster for adjusting, if the determined digital value is not equal to the target digital value, the gain so that a digital value corresponding to the adjusted gain is equal to the target digital value; and
   a gain setter for storing the adjusted gain in the gain setting table as a gain value associated with the maximum volume level for the selected externally sourced audio material.

14. The mobile terminal of claim 13, wherein the audio output unit comprises:
   a coder/decoder (codec) for converting the selected externally sourced audio material into an analog signal;
   a sound chip having an amplifier for amplifying the analog signal; and
   a speaker for outputting the amplified analog signal.

15. The mobile terminal of claim 14, wherein the digital value producer comprises:
   a rectifier for rectifying the amplified analog signal; and
   an analog to digital converter (ADC) for converting the rectified analog signal into digital values.

16. The mobile terminal of claim 14, wherein the gain adjuster comprises:
   a codec gain adjuster for adjusting a gain of the codec to change output sound pressure levels; and
   an amplifier gain adjuster for adjusting a gain of the amplifier to change the output sound pressure levels.

17. The mobile terminal of claim 16, wherein if the determined digital value is less than the target digital value, the codec gain adjuster increases the codec gain so that the difference between the digital value corresponding to the adjusted gain and the target digital value is minimized.

18. The mobile terminal of claim 17, wherein if the difference is not zero, the amplifier gain adjuster increases the amplifier gain so that the digital value corresponding to the further adjusted gain is equal to the target digital value.

19. The mobile terminal of claim 16, wherein if the determined digital value is greater than the target digital value, the amplifier gain adjuster decreases the amplifier gain so that the difference between the digital value corresponding to the adjusted gain and the target digital value is minimized.

20. The mobile terminal of claim 19, wherein if the difference is not zero, the codec gain adjuster decreases the codec gain so that the digital value corresponding to the further adjusted gain is equal to the target digital value.

21. The mobile terminal of claim 13, wherein the target digital value corresponds to 80% of the output sound pressure level at the maximum volume level of the speaker.

* * * * *